(12) United States Patent
Forrest et al.

(10) Patent No.: US 9,184,402 B2
(45) Date of Patent: Nov. 10, 2015

(54) PHOSPHORESCENT ORGANIC LIGHT EMITTING DIODES WITH HIGH EFFICIENCY AND BRIGHTNESS

(71) Applicant: The Regents of the University of Michigan, Ann Arbor, MI (US)

(72) Inventors: Stephen R. Forrest, Ann Arbor, MI (US); Yifan Zhang, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/268,398

(22) Filed: May 2, 2014

(65) Prior Publication Data

US 2014/0326972 A1    Nov. 6, 2014

Related U.S. Application Data

(60) Provisional application No. 61/818,653, filed on May 2, 2013, provisional application No. 61/876,462, filed on Sep. 11, 2013.

(51) Int. Cl.
*H01L 51/54* (2006.01)
*H01L 51/50* (2006.01)
(52) U.S. Cl.
CPC ......... *H01L 51/5016* (2013.01); *H01L 2251/55* (2013.01)

(58) Field of Classification Search
None
See application file for complete search history.

(56) References Cited

U.S. PATENT DOCUMENTS

2007/0278937 A1* 12/2007 Forrest et al. ................. 313/504
2012/0319088 A1* 12/2012 Lee et al. ....................... 257/40

OTHER PUBLICATIONS

Uoyama, Hiroki, Kenichi Goushi, Katsuyuki Shizu, Hiroko Nomura, and Chihaya Adachi. "Highly Efficient Organic Light-emitting Diodes from Delayed Fluorescence." Nature 492.7428 (2012): 234-38.*

* cited by examiner

*Primary Examiner* — Joseph Schoenholtz
(74) *Attorney, Agent, or Firm* — Morgan, Lewis & Bockius, LLP

(57) ABSTRACT

An organic light emitting device including a) an anode; b) a cathode; and c) an emissive layer disposed between the anode and the cathode, the emissive layer comprising an organic host compound and a phosphorescent compound exhibiting a Stokes Shift overlap greater than 0.3 eV. The organic light emitting device may further include a hole transport layer disposed between the emissive layer and the anode; and an electron transport layer disposed between the emissive layer and the cathode. In some embodiments, the phosphorescent compound exhibits a phosphorescent lifetime of less than 10 µs. In some embodiments, the concentration of the phosphorescent compound ranges from 0.5 wt. % to 10 wt. %.

11 Claims, 22 Drawing Sheets

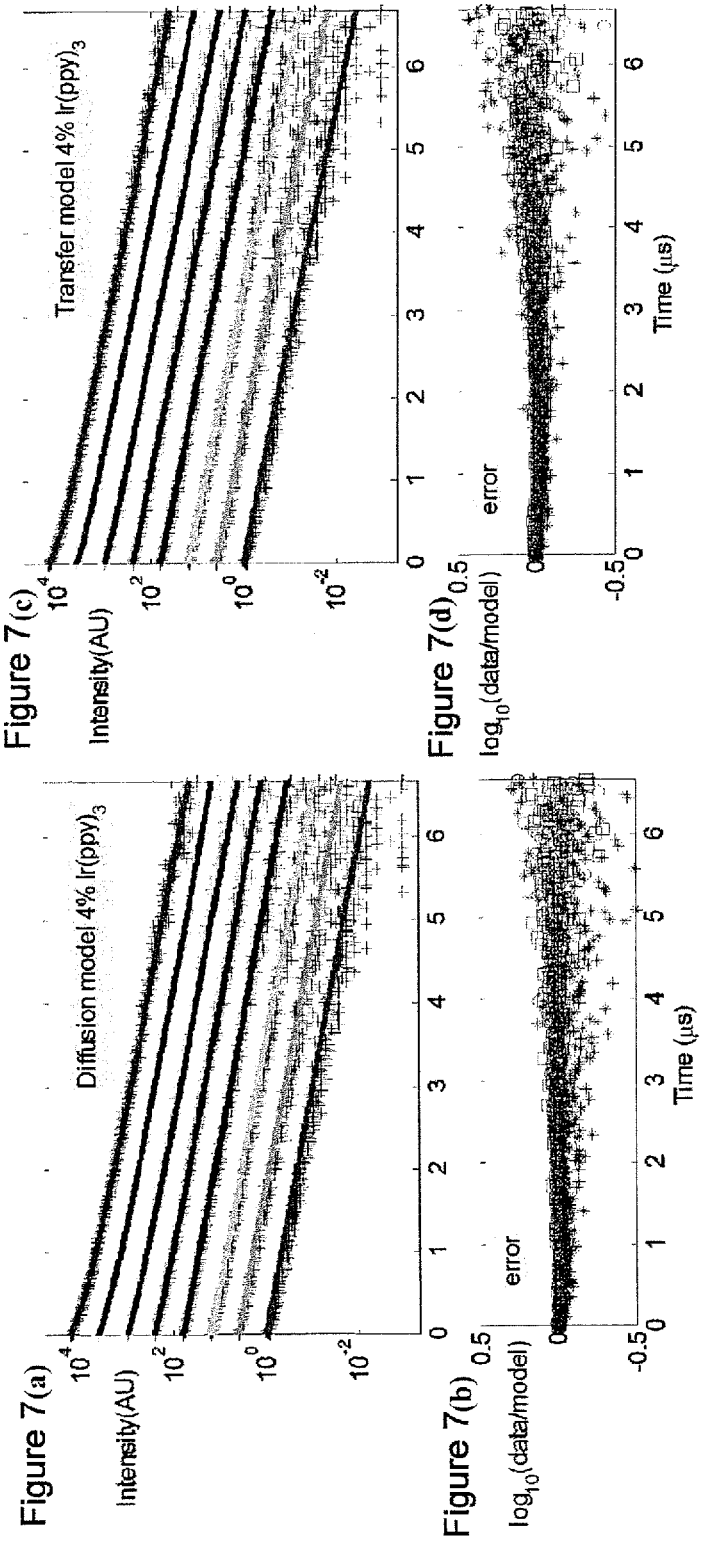

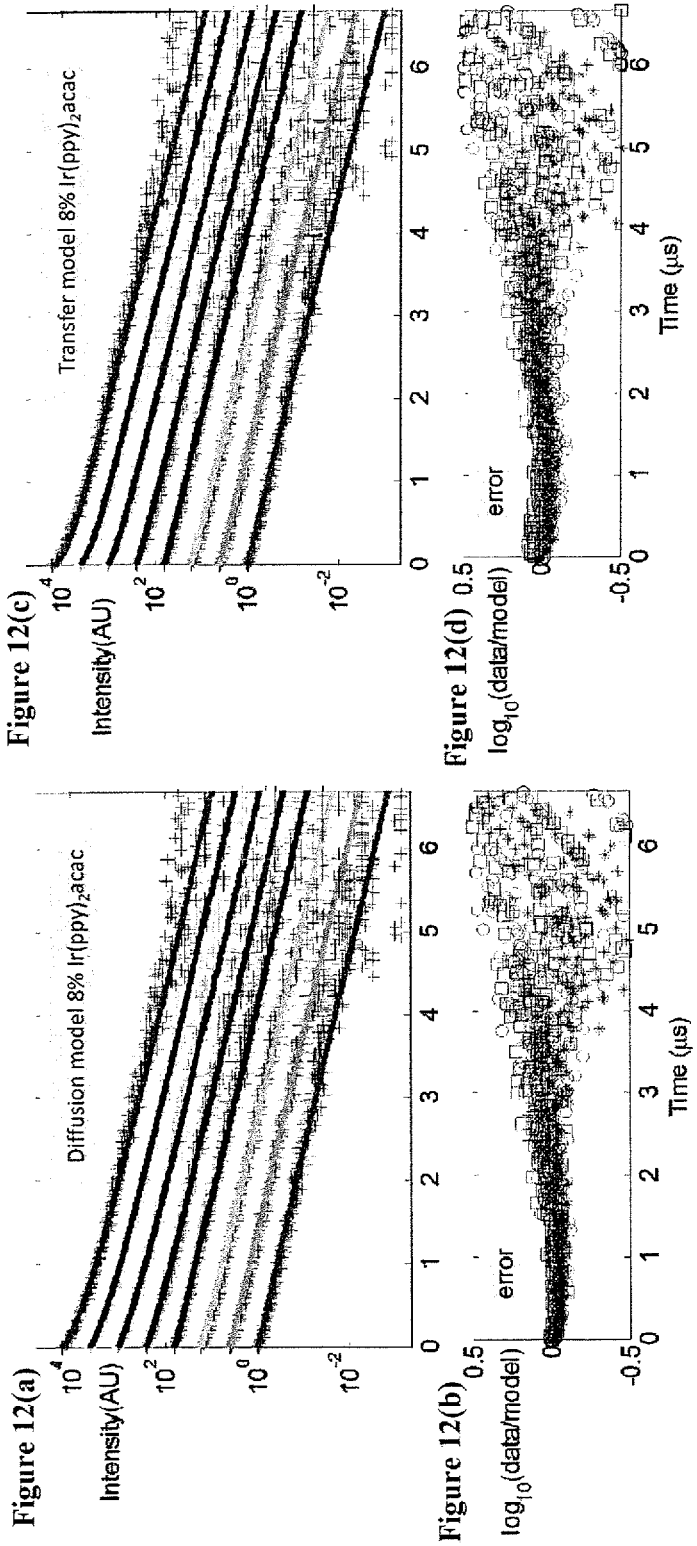

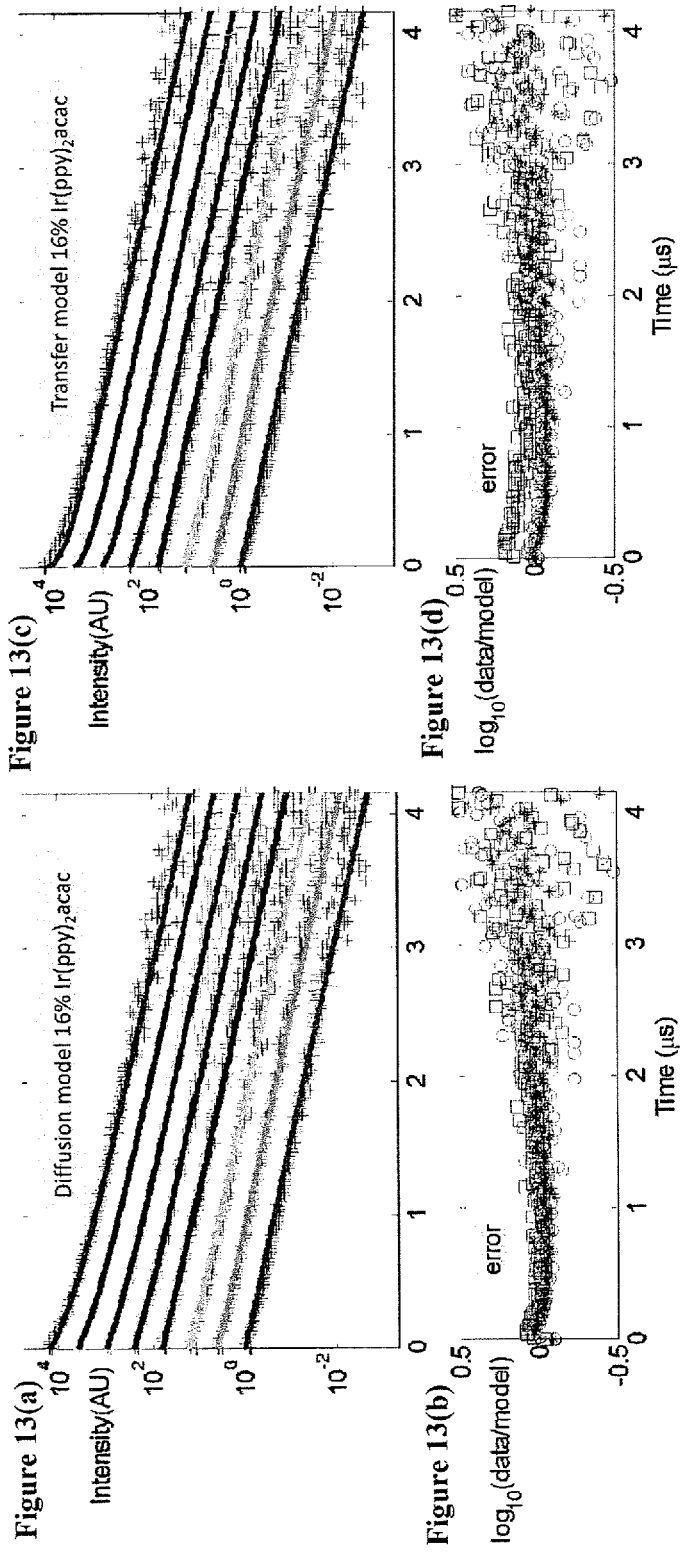

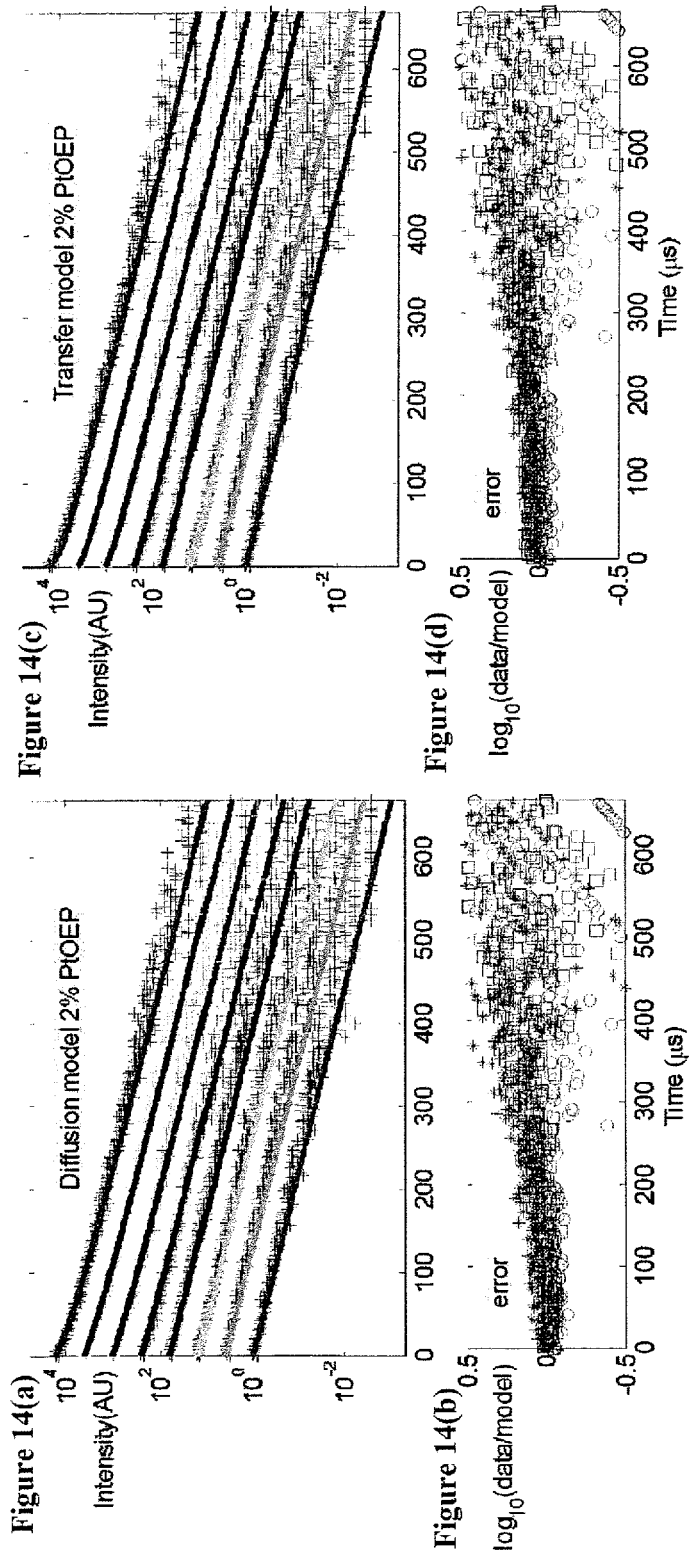

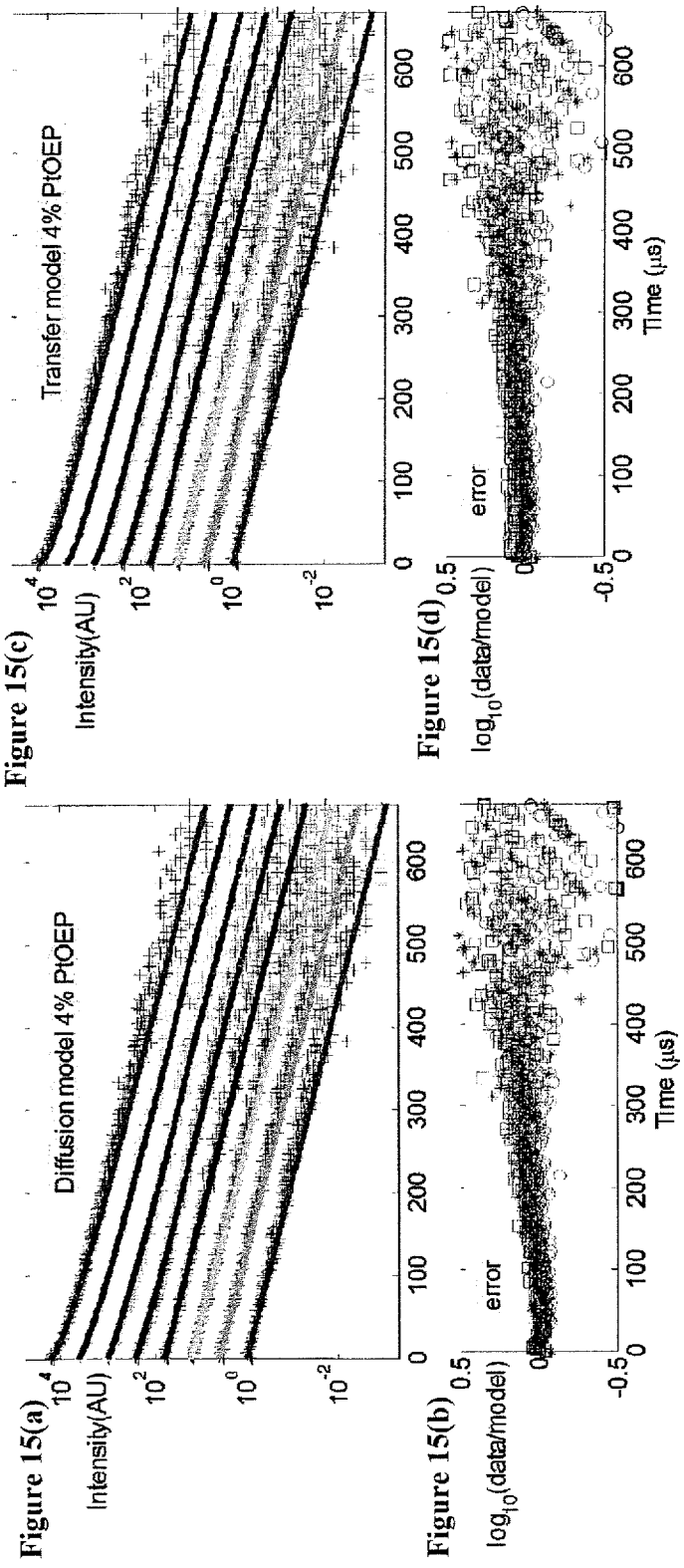

Figure 16(a) Diffusion model 8% PtOEP

Figure 16(c) Transfer model 8% PtOEP

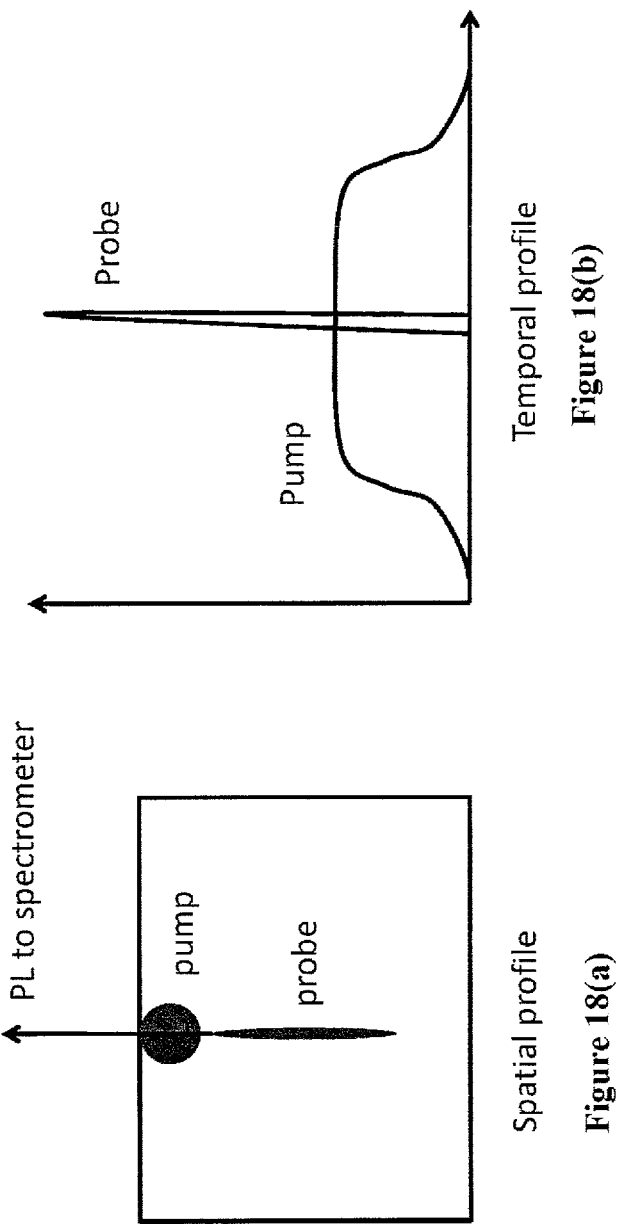

PHOSPHORESCENT ORGANIC LIGHT EMITTING DIODES WITH HIGH EFFICIENCY AND BRIGHTNESS

CROSS-REFERENCE TO RELATED APPLICATIONS

This application claims priority to, and the benefit of, U.S. Provisional Application Nos. 61/818,653, filed May 2, 2013, now pending, and 61/876,462, filed Sep. 11, 2013, now pending, all of which are incorporated herein by reference herein in their entireties.

STATEMENT AS TO RIGHTS TO INVENTIONS MADE UNDER FEDERALLY SPONSORED RESEARCH OR DEVELOPMENT

This work was supported by the U.S. Department of Energy (DOE), Office of Basic Energy Sciences, as part of the Center for Energy Nanoscience, Energy Frontier Research Center, Grant #DE-SC0001013 through the University of Southern California.

The claimed invention was made by, on behalf of, and/or in connection with the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF INVENTION

The present invention relates to organic light emitting devices. More specifically, the invention relates to organic light emitting devices having phosphorescent organic light emitters where triplet-triplet annihilation is minimized.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photo detectors.

Various ways to deposit the organic materials used to fabricate organic devices are known, such as vacuum thermal evaporation, solution processing, organic vapor phase deposition, and organic vapor jet printing.

SUMMARY OF THE INVENTION

In one embodiment, the present invention provides for an organic light emitting device including a) an anode; b) a cathode; and c) an emissive layer disposed between the anode and the cathode, the emissive layer comprising an organic host compound and a phosphorescent compound exhibiting a Stokes Shift overlap greater than 0.3 eV. In some embodiments, the phosphorescent compound exhibits a Stokes Shift overlap integral of less than 50 $M^{-1}$ $cm^{-1}$. The organic light emitting device may further include a hole transport layer disposed between the emissive layer and the anode; and an electron transport layer disposed between the emissive layer and the cathode. In some embodiments, the phosphorescent compound exhibits a phosphorescent lifetime of less than 10 μs. In some embodiments, the phosphorescent compound further exhibits a triplet-triplet annihilation rate constant of less than $1 \times 10^{-12}$ $cm^3 s^{-1}$. In some embodiments, the concentration of the phosphorescent compound ranges from 0.5 wt. % to 10 wt. %.

In some embodiments, the organic light emitting device exhibits a peak external quantum efficiency of greater than 10%. In some embodiments, the organic light emitting device exhibits a roll off quantum efficiency of 50% of the peak external quantum efficiency at a current density greater than 100 $mA/cm^2$.

In some embodiments, the organic light emitting device exhibits a roll off quantum efficiency of 50% of the peak external quantum efficiency at a current density greater 100 $mA/cm^2$ compared to an equivalent device having an emissive layer disposed between the anode and the cathode, the emissive layer comprising an organic host compound and a comparative phosphorescent compound exhibiting a Stokes Shift overlap less than 0.3 eV and a phosphorescent lifetime of greater than 5 μs. In some embodiments, the comparative phosphorescent compound exhibits a Stokes Shift overlap integral of greater than 50 $M^{-1}$ $cm^{-1}$.

In another embodiment, the present invention provides for a method for reducing triplet-triplet annihilation in an organic light emitting device comprising: providing a device comprising an anode; a cathode; and an emissive layer disposed between the anode and the cathode, the emissive layer comprising an organic host compound and a phosphorescent compound exhibiting a Stokes Shift overlap greater than 0.3 eV; applying a voltage across the anode and the cathode; wherein the device exhibits a peak external quantum efficiency of greater than 10%; and wherein the device exhibits a roll off quantum efficiency of 50% of the peak external quantum efficiency at a current density greater than 100 $mA/cm^2$. In some embodiments, the phosphorescent compound exhibits a Stokes Shift overlap integral of less than 50 $M^{-1}$ $cm^{-1}$. In some embodiments, the phosphorescent compound further exhibits a triplet-triplet annihilation rate constant of less than $1 \times 10^{-12}$ $cm^3 s^{-1}$.

BRIEF DESCRIPTION OF THE DRAWINGS

FIG. 2(a) illustrates photoluminescence (PL) transients from 8% Ir(ppy)$_3$ doped in CBP with two different initial peak triplet densities. The solid lines are fits to the diffusion-dominated triplet-triplet annihilation (TTA) model. FIGS. 2(b) and 2(c) show the residues of the fits based on diffusion and transfer models, respectively.

FIGS. 7(a)-7(d): illustrate PL transients of 4% Ir(ppy)$_3$ doped CBP, similarly analyzed as in FIGS. 6(a)-6(d).

FIG. 12(a)-12(d): illustrate PL transients of 8% Ir(ppy)$_2$acac doped CBP, similarly analyzed as in FIGS. 6(a)-6(d).

FIG. 13(a)-13(d): illustrate PL transients of 16% Ir(ppy)$_2$acac doped CBP, similarly analyzed as in FIG. 6.

FIG. 14(a)-14(d): illustrate PL transients of 2% PtOEP doped CBP, similarly analyzed as in FIGS. 6(a)-6(d).

FIG. 15(a)-15(d): illustrate PL transients of 4% PtOEP doped CBP, similarly analyzed as in FIG. S2.

FIG. 16(a)-16(d): illustrate PL transients of 8% PtOEP doped CBP, similarly analyzed as in FIGS. 6(a)-6(d).

FIGS. 18(a) and 18(b): illustrate a sketch of the spatial and temporal profiles used for the triplet absorption measurements. The PL generated by the pump beam is transmitted through the waveguide formed by Air/Organics/SiO$_2$ to the edge of the film and collected by a spectrometer.

DETAILED DESCRIPTION

Figure 1:
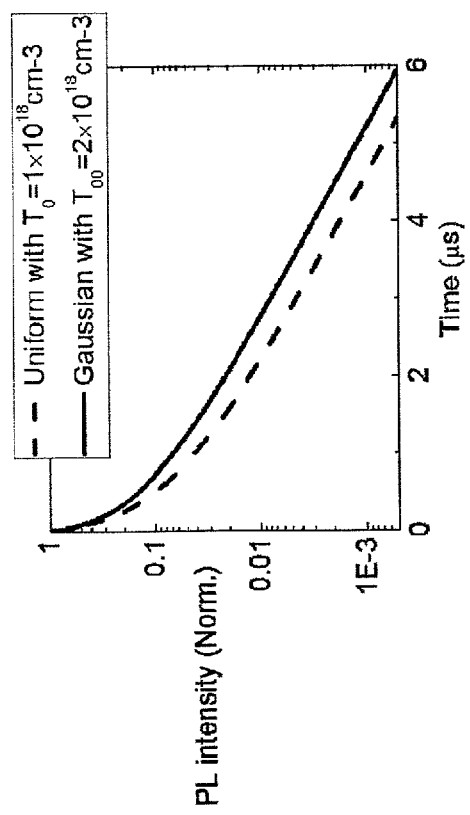
FIG. 1: illustrates calculated photoluminescence (PL) transients for 8% Ir(ppy)$_3$ doped CBP, with and without considering the Gaussian excitation profile. The total excitation energies in the two cases are set to be the same.

In organic molecules, triplet-triplet annihilation (TTA) can be dominated by triplet diffusion or triplet-to-triplet energy transfer. We have studied the diffusion and transfer dominated mechanisms in the context of photoluminescence (PL) transient measurements from archetype phosphorescent organic light emitters based on Ir and Pt complexes. We found that TTA in these emitters are controlled by diffusion due to a Dexter-type exchange interaction, suggesting triplet radiative decay and TTA are independent processes. Unexpectedly, we observed that minimizing the PL and absorption spectral overlap in phosphorescent emitters leads to a significantly decreased TTA rate, and thus only weak efficiency roll-off in phosphorescent organic light emitting diodes at high brightness.

N. J. Turro, Modern Molecular Photochemistry (University Science Books, Sausalito, Calif., 1991) has shown that due to Coulombic interactions, excitons (i.e. bound electron-hole pairs in a semiconductor) are responsible for optical transitions in organic molecules. Depending on the symmetry of the total spin, an exciton can be either an emissive singlet (antisymmetric) or a non-emissive triplet (symmetric) state. By introducing a heavy metal atom such as iridium or platinum into an organic molecule to enhance the spin-orbital coupling, spin-symmetry-breaking transitions can be allowed, and triplet emitters with unity luminescent efficiencies are possible as reported by C. Adachi et al., J. Appl. Phys. 90, 5048 (2001); M. A. Baldo et al., Appl. Phys. Lett. 75, 4 (1999); S. Lamansky et al., J. Am. Chem. Soc. 123, 4304 (2001); and Y. Kawamura et al., Appl. Phys. Lett. 86, 071104 (2005). As a result, highly efficient phosphorescent organic light emitting diodes (OLEDs) are now commercially available for widespread application to lighting and displays as reported by S. Reineke et al., Nature 459, 234 (2009); P. A. Levermore et al., Journal of the Society for Information Display 19, 943 (2011); M. S. Weaver et al., Journal of the Society for Information Display 14, 449 (2006); T. Tsujimura, OLED Displays: Fundamentals and Applications (John Wiley & Sons, Inc., Hoboken, N.J., 2012); and Y. Sun et al., Nature 440, 908 (2006). All OLEDs undergo a decrease in efficiency with increasing drive current density (and hence brightness). Bimolecular triplet-triplet annihilation (TTA) has been identified by M. A. Baldo, C. Adachi, and S. R. Forrest, Phys. Rev. B 62, 10967 (2000); S. Reineke, K. Walzer, and K. Leo, Phys. Rev. B 75, 125328 (2007); and M. A. Baldo et al., Nature 395, 151 (1998) as a significant loss mechanism that leads to such an efficiency roll-off. In phosphorescent emitters with rapid singlet-to-triplet intersystem crossing, a single TTA event follows the equation: $T^*+T^*\to S_0+T^*$, where the first triplet $T^*$ is de-excited by the second triplet, and $S_0$ represents the ground state which almost always carries singlet symmetry. Because the rate of this reaction is a decreasing function of the distance between the two interacting triplets, a description of cumulative TTA events should include both triplet diffusion and triplet-to-triplet energy transfer.

To understand the contribution of TTA to efficiency roll-off in OLEDS, we compared the relative dominance of two processes leading to TTA: diffusion and direct energy transfer. We first introduce triplet density dynamical models for the two scenarios, and then compare the photoluminescence (PL) transients from archetype phosphorescent emitters to calculations based on the models. We found that TTA is primarily the result of triplet diffusion, and further, the diffusion clearly follows Dexter exchange energy transfer which is described by D. L. Dexter, The Journal of Chemical Physics 21, 836 (1953).

In S. Chandrasekhar, Reviews of Modern Physics 15, 1 (1943), Smoluchowski's theory of coagulation predicts the widely adopted triplet density dynamics equation for diffusion dominated TTA which is described in M. A. Baldo, C. Adachi, and S. R. Forrest, Phys. Rev. B 62, 10967 (2000); S. Reineke, K. Walzer, and K. Leo, Phys. Rev. B 75, 125328 (2007); R. G. Kepler et al., Phys. Rev. Lett. 10, 400 (1963); J. C. Ribierre et al., Phys. Rev. Lett. 100, 017402 (2008); R. P. Groff, R. E. Merrifield, and P. Avakian, Chem. Phys. Lett. 5, 168 (1970); and E. B. Namdas et al., Appl. Phys. Lett. 86, 091104 (2005):

$$\frac{dT}{dt} = -\frac{T}{\tau} - \frac{1}{2}k_{TT}T^2, \quad (1)$$

where T is the triplet density, $\tau$ is the triplet natural lifetime, and $k_{TT}$ is the TTA rate constant. Eq. (1) assumes that the triplet-to-triplet energy transfer rate is infinite when two triplets are within a capture radius, $R_C$, and zero outside. The quadratic dependence of TTA on triplet density arises from counting the flux of triplets onto the capture radius of each other during diffusion. Then, $k_{TT}$ is related to triplet diffusivity, D, via:

$$k_{TT} = 8\pi R_C D. \quad (2)$$

In the case of energy-transfer-dominated TTA where triplets are assumed to be immobile in the solid, Staroske et al., Phys. Rev. Lett. 98, 197402 (2007) and Engel et al., Chem. Phys. 325, 170 (2006), derived a time dependent expression for $k_{TT}$ from Förster transfer of energy between triplets. The derivation of the model by Staroske and Engel is based on the dynamics of Förster energy transfer from sensitizer to acceptor. These dynamics were first solved by Förster Z. Naturforsch. A4, 321 (1949), in which the excited sensitizer (i.e. donor) density following a pulsed excitation are given by:

$$n(t) = n_0 \exp\left[-\frac{t}{\tau} - \frac{4}{3}\pi R_{SA}^3 \sqrt{\frac{\pi t}{\tau}} N_A\right] \quad (3)$$

where $n_0$ is the initial excited sensitizer density, $\tau$ is its lifetime, $R_{SA}$ is the sensitizer-to-acceptor Förster radius, and $N_A$ is the density of acceptor sites which is time independent. Starting from Eq. (3), Staroske and Engel asserted a time dependent density of acceptor sites whereby $N_A = n(t)$, leading to inconsistencies in their annihilation model.

The inconsistency of Staroske is apparent by checking Storoske's Eq. (1):

$$\frac{dn(t)}{dt} = -\frac{n(t)}{\tau} - \gamma n(t)^2,$$

using Storoske's solutions of Eq. (3) herein, except for $N_A = n(t)$ and $$\gamma(t) = \frac{2}{3}\pi R_{SA}^3 \sqrt{\frac{\pi}{\tau t}}.$$

This leads to, $$\text{left-hand side} = -n(t) \times \left[\frac{1}{\tau} + \gamma(t)\Box n(t) + 2t\Box\gamma(t)\Box\frac{dn}{dt}\right] \quad (4)$$

$$\text{right-hand side} = -n(t) \times \left[\frac{1}{\tau} + \gamma(t)\Box n(t)\right] \quad (5)$$

Equation (4) differs from Eq. (5) by a factor related to $$\frac{dn}{dt}.$$

However, these derivations are problematic as they assert that the triplet donor and acceptor molecular densities are equal using a framework where this leads to an inconsistent solution to the rate equations from which these densities are derived in T. Förster, Z. Naturforsch. A4, 321 (1949); K. B. Eisenthal, and S. Siegel, The Journal of Chemical Physics 41, 652 (1964); and R. C. Powell, and Z. G. Soos, J. Lumin. 11, 1 (1975).

Here, we derive the dynamics of TTA using a self-consistent solution to triplet-to-triplet Förster transfer. That is, assuming triplets are evenly distributed on cubic lattice, the de-excitation rate of one triplet due to all other triplets is:

$$k_{FTT} = \frac{1}{\tau}\left(\frac{R_{FTT}}{a_T}\right)^6 \times \left[\frac{6}{(\sqrt{1})^6} + \frac{12}{(\sqrt{2})^6} + \frac{8}{(\sqrt{3})^6} + \ldots\right], \quad (6)$$

where $R_{FTT}$ is the Förster radius of triplet-to-triplet energy transfer, T. Förster, Discuss. Faraday Soc. 27, 7 (1959), and $a_T$ is the lattice constant given by $a_T = 1/\sqrt[3]{T}$. The series in Eq. (7) counts the contributions from the six nearest neighbors, the eight second nearest neighbors, etc., and rapidly converges. Thus:

$$\frac{dT}{dt} = -\frac{T}{\tau} - \frac{1}{2}\beta_{TT}T^3, \quad (7)$$

where $$\beta_{TT} \approx \frac{8}{\tau}R_{FTT}^6. \quad (8)$$

In the following discussion, we refer to Eq. (1) as the diffusion model, and Eq. (7) as the transfer model.

To compare the predictions of Eqs. (1) and (7), we studied three archetype phosphorescent dopants: tris(2-phenylpyridine)iridium ($Ir(ppy)_3$), bis(2-phenylpyridine)(acetylacetonate)iridium ($Ir(ppy)_2(acac)$), and octaethyl-porphine platinum (PtOEP), doped into a 4,4'-N,N'-dicarbazole-biphenyl (CBP) host. A total of twelve 40 nm thick films with volume doping concentrations C=2%, 4%, 8%, and 16% of each dopant were grown by vacuum thermal evaporation at base pressure $<5\times10^{-7}$ Torr on quartz substrates. The films were excited using the output of a 20 Hz repetition rate, and 1 ns pulse width nitrogen laser at a wavelength of $\lambda=337$ nm under an ultrahigh purity nitrogen environment. The laser beam focused on the films had a Gaussian profile with a full width at half maximum of 300 μm, and its intensity was controlled by neutral density filters. The resulting PL transients were measured by a streak camera (Hamamatsu C4334) with a temporal resolution of 1 ns. Transients for each film were fit to both the diffusion and transfer models described herein. The pump intensities were varied such the initial triplet densities are $1 \times 10^{16}$ cm$^{-3}$ and $2 \times 10^{18}$ cm$^{-3}$. The PL transients are illustrated in FIGS. 6-17.

The Stokes shift integral may be defined by, $\int PL(\lambda)A(\lambda)d\lambda$, where $PL(\lambda)$ is the emitter PL spectrum (having the unit of 1/nm) normalized to the emitter quantum efficiency $\Phi$ through $\Phi = \int PL(\lambda)d\lambda$, $A(\lambda)$ is the emitter molar absorption coefficient (having the unit of M$^{-1}$ cm$^{-1}$). Usually, $A(\lambda)$ is measured for emitters dissolved in solutions. The integrals for (Ir(ppy)$_3$) and (PtOEP) are 146 M$^{-1}$ cm$^{-1}$ and 3.3 M$^{-1}$ cm$^{-1}$ respectively, and (Ir(ppy)$_2$(acac)) should have an integral comparable to (Ir(ppy)$_3$).

From the diffusion model, Eq. (1) above can be directly solved to obtain:

$$T(t) = \frac{2}{(2 + T_0 k_{TT} \tau) \exp(t/\tau) - T_0 k_{TT} \tau}. \quad (9)$$

Now, the initial triplet follows a Gaussian distribution $T(r) = T_{00} \cdot e^{r^2/2\sigma^2}$, as a result of Gaussian pump beam profile. The temporal PL response is then:

$$PL(t) = \int_{r=0}^{F=\alpha} T(t, T_0 = T_{00} \cdot e^{r^2/2\sigma^2}) 2\pi r\, dr, \quad (10)$$

which can be analytically solved to give Eq. (12) herein below. Similarly, from Eq. (7), $$T(t) = \sqrt{\frac{2T_0^2}{(2 + \tau T_0^2 \beta) \exp(2t/\tau) - \tau T_0^2 \beta}} \quad (11)$$

which can be similarly integrated to yield Eq. (13) herein below.

FIG. 1 illustrates a comparison of two calculated PL transients with (Eq. (12)) and without (Eq. (9)) considering the Gaussian profile using the parameters for 8% Ir(ppy)3 doped CBP in Table 1 below. The initial triplet density for a uniform circular exciton distribution of radius σ is chosen to be $T_0 = 1 \times 10^{18}$ cm$^{-3}$, if the same energy (or total triplet population) follows Gaussian distribution, the peak density is $T_{00} = 2 \times 10^{18}$ cm$^{-3}$. From the comparison, the Gaussian distribution gives an observably different PL transient than does a uniform distribution; therefore, Eqs. (12) and (13) are necessary for accurate fits to the PL transients.

FIG. 2 shows representative transients for 8% Ir(ppy)$_3$ doped in CBP. The PL transient at the lowest pump intensity shows no TTA (corresponding to only a mono-exponential decay transient), while at the highest pump intensity, only negligible host emission is observed. An initial 2-D Gaussian triplet distribution results from the pump beam profile following: $T(r) = T_{00} \cdot e^{r^2/2\sigma^2}$. Under our experimental conditions, this corresponds to the peak triplet density, $T_{00}$, varied from $1 \times 10^{16}$ cm$^{-3}$ to $2 \times 10^{18}$ cm$^{-3}$.

Figure 19:
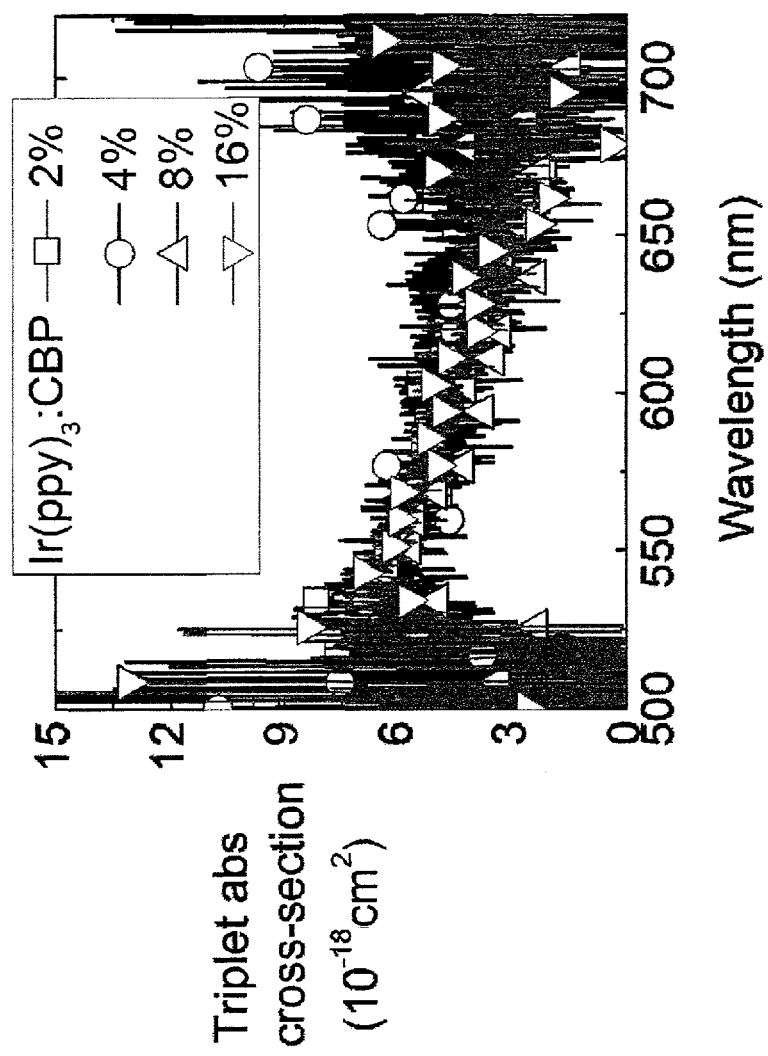
FIG. 19: illustrates triplet absorptions for Ir(ppy)$_3$ doped CBP with different doping concentrations.
Figure 20:
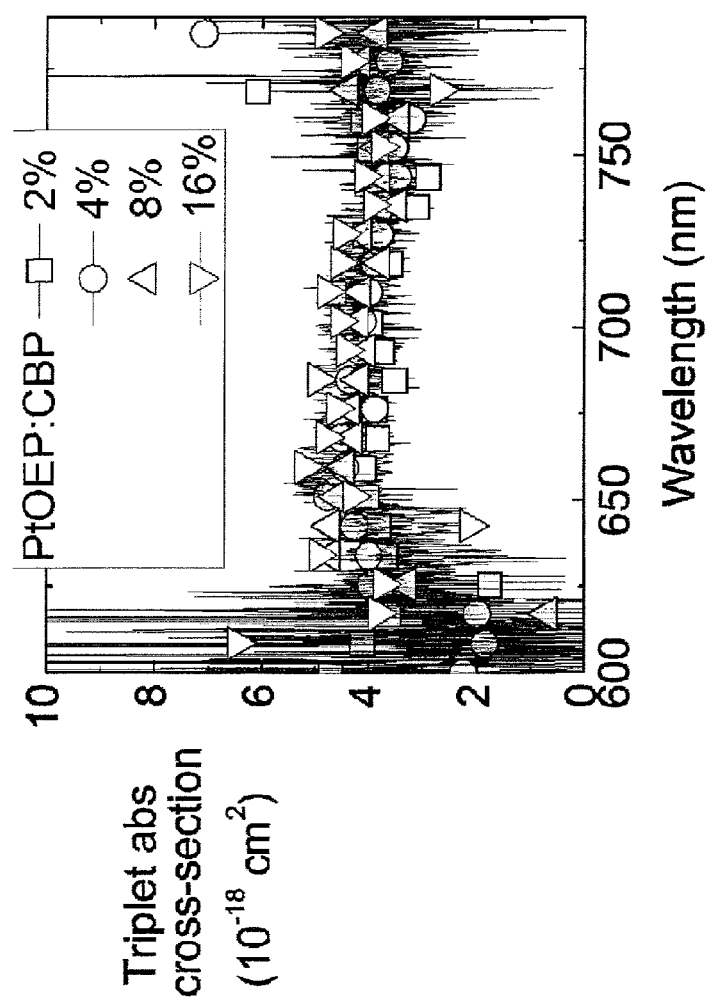
FIG. 20: illustrates riplet absorptions for PtOEP doped CBP with different doping concentrations.

Triplet absorption is measured for 200 nm films deposited on 2 μm SiO$_2$ on a Si substrate. FIGS. 19 and 20 illustrate triplet absorptions for Ir(ppy)$_3$ and PtOEP, respectively, doped CBP with different doping concentrations. The pump pulse is the CW output from a He—Cd laser at a wavelength of 325 nm, shaped to a 20 μs pulse-with and 20 Hz repetition rate using a chopper. The pump spot radius is 700 μm, and is focused close to the sample edge. The probe pulse is from a N$_2$ laser, focused to 300 μm by 2 mm stripe perpendicular to sample edge, and spatially separated from pump spot by 100 μm. The timing of the probe pulse is delayed from the pump onset by 10 μs. To characterize the absorption of the pump by probe-generated triplets, we compared three PL intensities from the: pump only, probe only, and in the presence of both. The triplet absorption fraction is then given by:

$$ABS = \frac{PL_{Pump} + PL_{Probe} - PL_{Both}}{PL_{Both}}$$

from which triplet absorptivity can be calculated.

For the time (>>1 ns) and triplet density range studied, triplets only reside on the dopant (emissive) molecules due to the high CBP triplet energy of 2.6 eV compared to Ir(ppy)$_3$ (2.4 eV), Ir(ppy)$_2$(acac) (2.4 eV) and PtOEP (1.9 eV) previously reported in C. Adachi et al., J. Appl. Phys. 90, 5048 (2001) and M. A. Baldo, and S. R. Forrest, Phys. Rev. B 62, 10958 (2000). When using the diffusion or transfer model to fit the transients, we average the PL transients over the Gaussian profile. From Eq. (1), the PL transient is given by:

$$PL(t) = PL(t=0) \times \frac{2}{T_{00} k_{TT} \tau [\exp(t/\tau) - 1]} \times \quad (12)$$

$$\ln\left[1 + \frac{1}{2} T_{00} k_{TT} \tau (1 - \exp(-t/\tau))\right]$$

and from Eq. (4), the PL transient is:

$$PL(t) = PL(t=0) \times \sqrt{\frac{2}{\tau T_{00}^2 \beta_{TT}(e^{2t/\tau} - 1)}} \times \quad (13)$$

$$\ln\left[\sqrt{\frac{\tau T_{00}^2 \beta_{TT}(e^{2t/\tau} - 1)}{2e^{2t/\tau}}} + \sqrt{\frac{\tau T_{00}^2 \beta_{TT}(e^{2t/\tau} - 1)}{2e^{2t/\tau}} + 1}\right],$$

where PL(t) is the PL intensity proportional to total triplet population at time, t. We restricted the fit parameters τ, $k_{TT}$ (diffusion model) or $\beta_{TT}$ (transfer model) to be constant for a given film under different initial triplet densities, $T_{00}$. The fit results from all films are summarized in Table 1.

TABLE 1

Parameters for the PL transients fits using the diffusion and transfer models

| Vol % | τ (μs) | $k_{TT}$ ($10^{-13}$ cm$^3$s$^{-1}$) | $\beta_{TT}$ ($10^{-30}$ cm$^6$s$^{-1}$) | $R_{FTT}$ (nm) |
|---|---|---|---|---|
| Ir(ppy)$_3$ | | | | |
| 2% | 1.22 ± 0.01 | 13 ± 1 | 1.9 ± 0.3 | 8.1 |
| 4% | 1.19 ± 0.01 | 21 ± 1 | 3.3 ± 0.4 | 8.9 |
| 8% | 1.08 ± 0.01 | 25 ± 2 | 7.2 ± 0.9 | 10.0 |
| 16% | 0.94 ± 0.01 | 36 ± 4 | 17 ± 3 | 11.2 |
| Ir(ppy)$_2$(acac) | | | | |
| 2% | 1.41 ± 0.01 | 23 ± 2 | 4.7 ± 0.3 | 9.7 |
| 4% | 1.22 ± 0.01 | 32 ± 2 | 8.9 ± 1.1 | 10.5 |
| 8% | 1.02 ± 0.01 | 39 ± 3 | 9.3 ± 2.0 | 10.3 |
| 16% | 0.67 ± 0.01 | 50 ± 5 | 28.1 ± 4.0 | 11.5 |

TABLE 1-continued

Parameters for the PL transients fits
using the diffusion and transfer models

| Vol % | $\tau$ ($\mu$s) | $k_{TT}$ ($10^{-13}$ cm$^3$s$^{-1}$) | $\beta_{TT}$ ($10^{-30}$ cm$^6$s$^{-1}$) | $R_{FTT}$ (nm) |
|---|---|---|---|---|
| PtOEP | | | | |
| 2% | 98 ± 2 | 0.13 ± 0.02 | (4.7 ± 1.6) × 10$^{-3}$ | 6.2 |
| 4% | 95 ± 1 | 0.23 ± 0.02 | (7.7 ± 1.5) × 10$^{-3}$ | 6.7 |
| 8% | 88 ± 1 | 0.41 ± 0.03 | (13 ± 2) × 10$^{-3}$ | 7.2 |
| 16% | 84 ± 1 | 0.52 ± 0.05 | (9.4 ± 2) × 10$^{-3}$ | 6.8 |

Figures 2A, 2B, 2C:
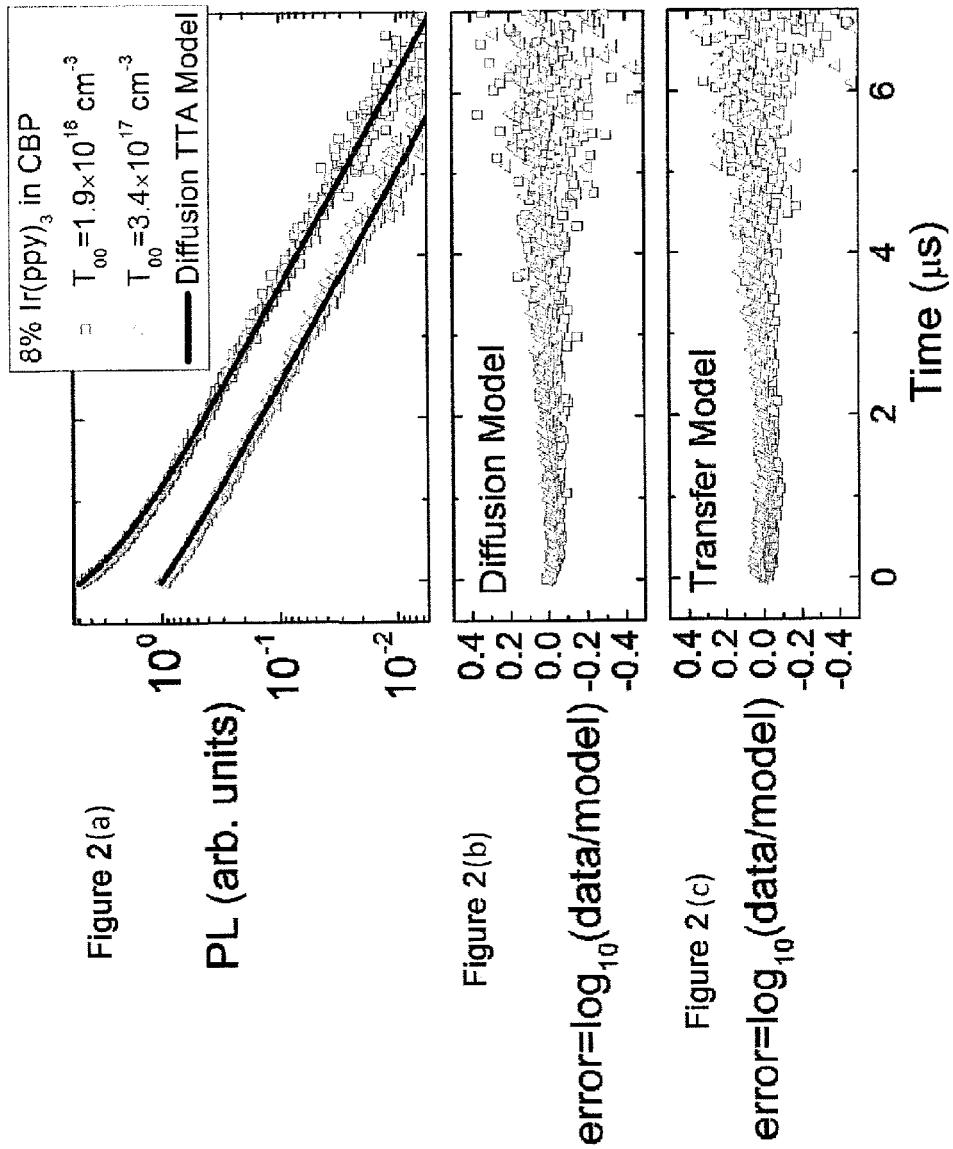
FIGS. 2(a)-2(c)

FIGS. 2(b) and (c) show the residues of the fits to Eq. (12) and (13), respectively. The residues are small in both cases, and hence the two models cannot be distinguished based only on the fits.

From the transfer model results in Table 1, $R_{FTT}$ can be calculated from $\tau$ and $\beta_{TT}$ using Eq. (8). The two Ir complexes show comparable $R_{FTT}$ ranging from 8 nm to 12 nm, while the Pt complex shows a somewhat smaller $R_{FTT} \approx 7$ nm. In all three cases, there is an increasing trend in $R_{FTT}$ with doping concentration.

To understand the fit results, $R_{FTT}$ can be estimated from Förster transfer theory where:

$$R_{FTT} = \left[\frac{3h^4c^4}{4\pi n^4} \int \frac{1}{E^4} F_D(E)\sigma_A(E)dE\right]^{1/6}. \quad (14)$$

Here, c is the speed of light, E is the photon energy, n is the refractive index, $F_D(E)$ is the PL spectrum of the donor molecule normalized to its PL quantum efficiency, $\Phi_{PL}$ (or $\int F_D(E)dE = \Phi_{PL}$), $\sigma_A(E)$ is the absorption cross-section (in cm$^2$) of the acceptor molecule which is related to the molar absorptivity via $\epsilon = \sigma_A \times 6.02 \times 10^{20}$ M$^{-1}$ cm$^{-1}$. Here, the phosphorescent molecule serves as both donor and acceptor for the triplet.

Figure 3:
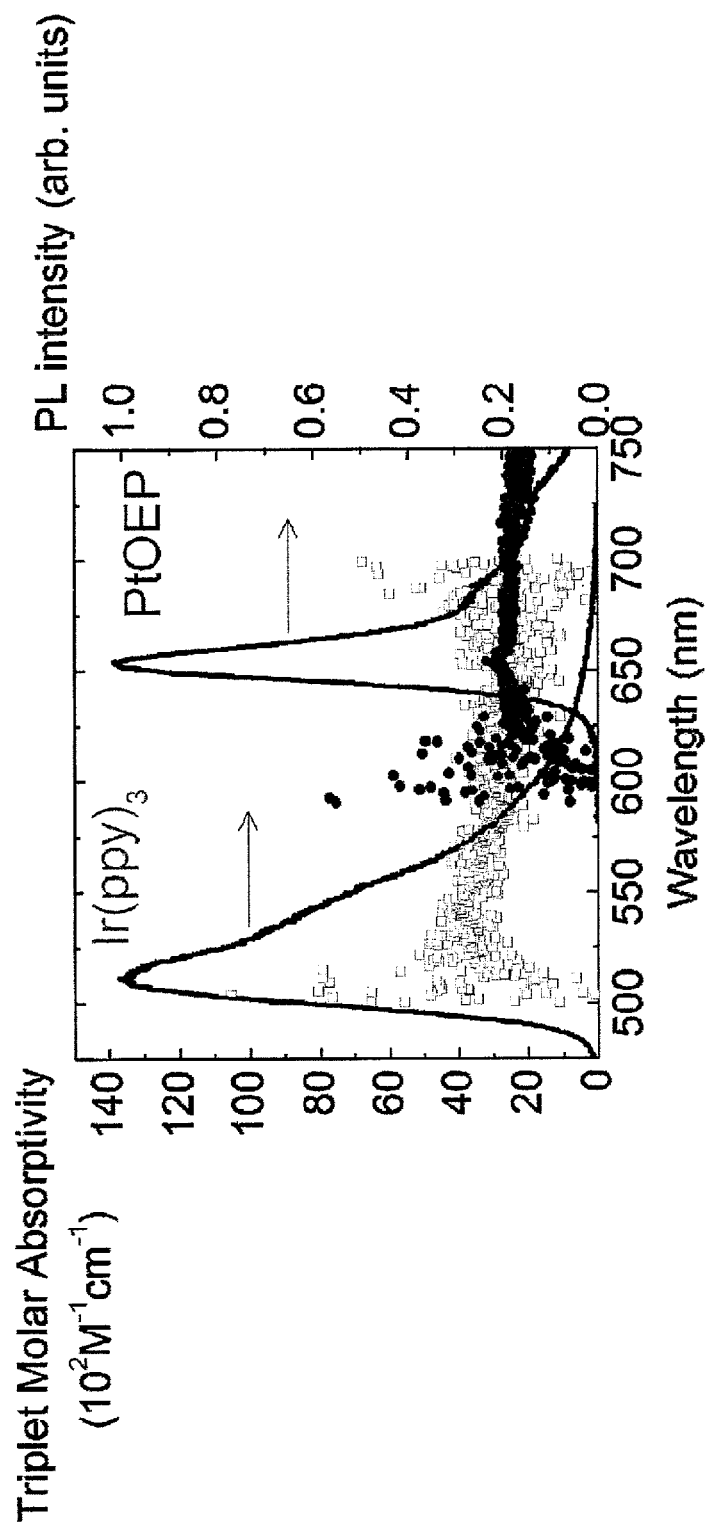
FIG. 3: illustrates molar absorptivity of triplets of Ir(ppy)$_3$ (open square) and PtOEP (open circle), as well as the corresponding PL spectra (lines). The spectra are measured from films at 8% doping concentration in CBP.

FIG. 3 shows the PL and triplet absorption spectra of Ir(ppy)$_3$ and PtOEP, where the triplet absorption spectrum is measured using the spatially separated pump-probe method as described in T. Förster, Discuss. Faraday Soc. 27, 7 (1959); M. A. Baldo, and S. R. Forrest, Phys. Rev. B 62, 10958 (2000); and M. Lehnhardt et al., Org. Electron. 12, 1346 (2011). Note that the PtOEP triplet absorption spectrum is similar in shape to that reported by Ponterini, et al., J. Am. Chem. Soc. 105, 4639 (1983) for PtOEP in tetrahydrofuran solution, and close to the estimation of Staroske, et al., Phys. Rev. Lett. 98, 197402 (2007). Thus using literature values for $\Phi_{PL}$ (~100% for the Ir-complexes reported in C. Adachi et al., J. Appl. Phys. 90, 5048 (2001); Y. Kawamura et al., Appl. Phys. Lett. 86, 071104 (2005); and Y. Kawamura et al., Phys. Rev. Lett. 96, 017404 (2006), and ~25% for PtOEP as reported in M. A. Baldo et al., Nature 395, 151 (1998) and M. A. Baldo et al., Phys. Rev. B 60, 14422 (1999)), the Förster radius is calculated from Eq. (14) to be $R_{FTT}$=3.1 nm for Ir(ppy)$_3$ and 2.7 nm for PtOEP.

Both the PL and triplet absorption are insensitive to doping concentration. Hence, the concentration dependence of $R_{FTT}$ in Table 1 cannot be understood from the theory in Eq. (14). Furthermore, $R_{FTT}$ obtained from the PL transient fits (Table 1) is larger than the estimation by a factor of 2 to 3, leading to 100-1000 times discrepancy in $\beta_{TT} \sim R_{FTT}^6$ (c.f. Eq. (8)). Thus, Förster transfer is significantly slower than the TTA inferred from the PL transients, suggesting that the description offered by the transfer model for TTA is inadequate.

The exciton diffusion model is based on the two possible mechanisms: Förster diffusion and Dexter diffusion. These two mechanisms lead to two corresponding expressions for diffusivity:

$$D_F = \frac{a^2}{6}k_{FH} = \frac{a^2}{6}\frac{1}{\tau}\left(\frac{R_F}{a}\right)^6 \quad (15)$$

and $$D_D = \frac{a^2}{6}k_{DH} = \frac{a^2}{6}KJ\exp\left(-\frac{2a}{L}\right), \quad (16)$$

where $D_F$ and $D_D$ are diffusivities due to Förster and Dexter transfer respectively, $k_{FH}$ and $k_{DH}$ are the corresponding hopping rates, a is the dopant lattice constant related to C through $a = 1/\sqrt[3]{C \times 10^{21} \text{cm}^{-3}}$, where a film molecular density of $10^{21}$ cm$^{-3}$ is adopted, $R_F$ is the triplet-to-ground-state Förster radius, K is related to exchange interaction Hamiltonian, J is the density of states for energy transfer, and L is the effective Bohr radius. It is clear that the two mechanisms lead to significantly different functional dependence of D on a.

Figure 4:
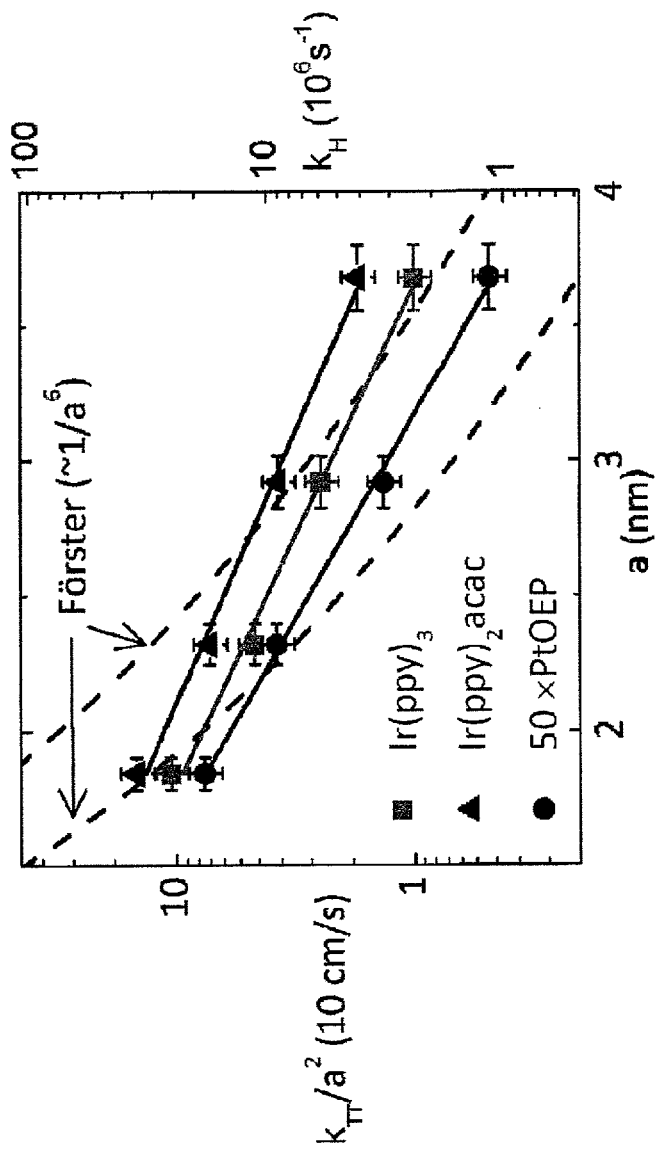
FIG. 4: illustrates comparison between two triplet diffusion mechanisms, Förster transfer (with 1/a$^6$ dependence) and Dexter transfer (exponential dependence on a). The TTA rate constants, $k_{TT}$, are obtained from PL transient fit parameters in Table 1. The hopping rates, $k_H$, on the right-hand ordinate are calculated assuming a capture radius of 1 nm. Note that the data for PtOEP are multiplied by 50.

The experimental dependence of D on a can be derived from Eq. (2) and $k_{TT}$ (see Table 1). Assuming $R_C$ is independent of a, then Eqs. (2), (15), and (16) suggest that $k_{TT}/a^2 \sim 1/a^6$ for Förster-mediated diffusion, and follows an exponential function for Dexter diffusion. A comparison of the behavior of $k_{TT}$ vs. a for the two mechanisms is shown in FIG. 4. For all three dopants, the data are consistent with Dexter diffusion; a conclusion consistent with Namdas, et al., Appl. Phys. Lett. 86, 091104 (2005) and Ribierre, et al., Phys. Rev. Lett. 100, 017402 (2008), for TTA in Ir-cored dendrimers. Assuming $R_C$=1 nm, we also calculate the hopping rate $$k_H = \frac{6k_{TT}}{8\pi a^2}$$

on the right-hand ordinate of FIG. 3. From this we can estimate the average number of hopping steps that a triplet makes before collision with a second triplet by $\tau k_H$. This process varies between 3 and 30 steps, depending on the doping concentration.

Interestingly, from Eq. (16), $D_D$ and thus $k_{TT}$ should be independent of $\tau$; however, $k_{TT}$ for the two Ir-complexes is 100 times greater for the Ir-complexes than for PtOEP, while their radiative lifetimes of the are only 1% of the PtOEP lifetime. This inverse correlation can be understood by evaluating J in Eq. (16) given by N. J. Turro, Modern Molecular Photochemistry (University Science Books, Sausalito, Calif., 1991) and D. L. Dexter, The Journal of Chemical Physics 21, 836 (1953):

$$J = \int F_D(E)\sigma_A(E)dE \quad (17)$$

where the donor is the dopant triplet state, and the acceptor is the dopant ground state. If we only consider the optically allowed transitions, $F_D(E)$ needs to be normalized to the PL quantum efficiency.

Figure 5:
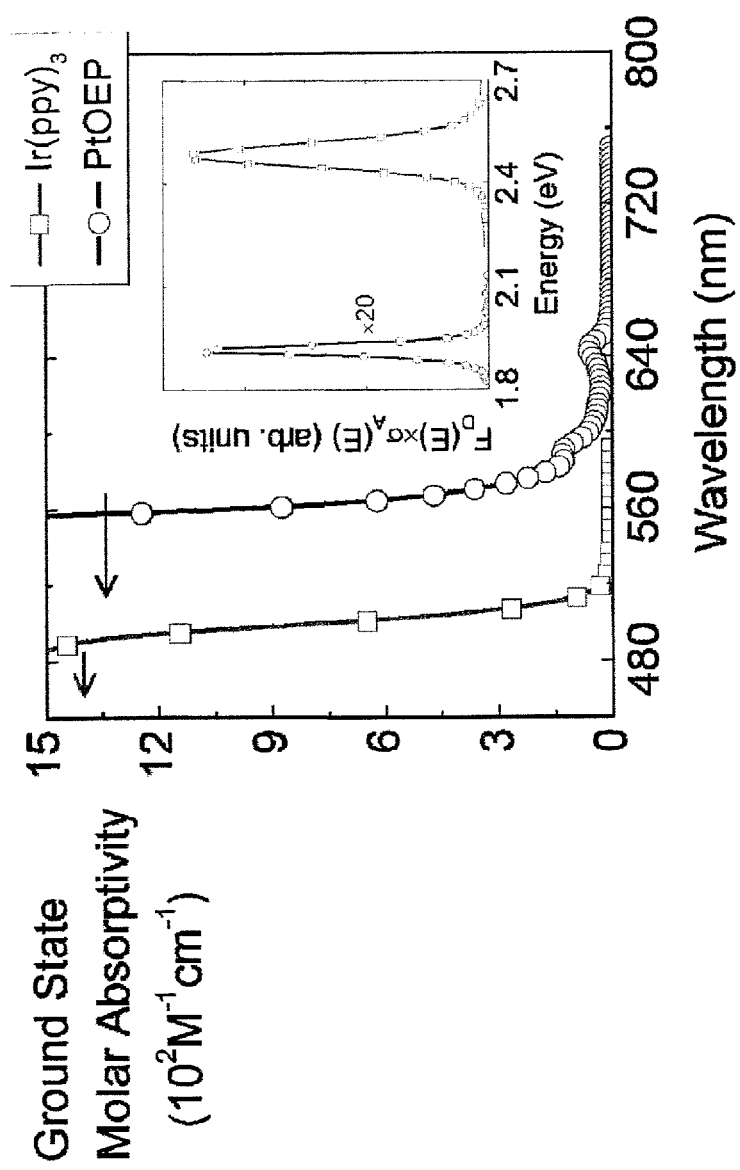
FIG. 5: illustrates absorption spectra of Ir(ppy)$_3$ and PtOEP dissolved in toluene, shown only in the wavelength range of their corresponding PL spectra. The spectral overlap (or the product of the absorption and PL spectra at each photon energy) between the thin film PL and absorption in solution are shown in the inset.
Figure 6A:
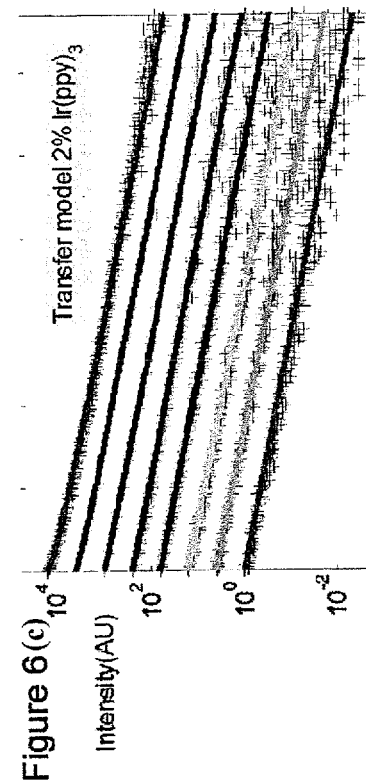
FIGS. 6(a)-6(d): illustrate PL transients of 2% Ir(ppy)$_3$ doped CBP, with initial peak triplet densities T00 between $1\times10^{16}$ cm$^{-3}$ and $2\times10^{18}$ cm$^{-3}$. The transients are fit using both the diffusion (FIGS. 6(a) and 6(b)) and transfer (FIGS. 6(c) and 6(d)) models, and the residues for $T_{00}=3.1\times10^{16}$ cm$^{-3}$, $3.4\times10^{17}$ cm$^{-3}$, and $1.9\times10^{18}$ cm$^{-3}$ are shown for comparison between the two models.
Figure 6B:
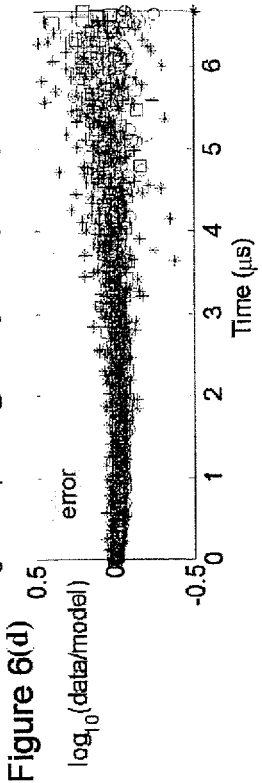
Figure 6C:
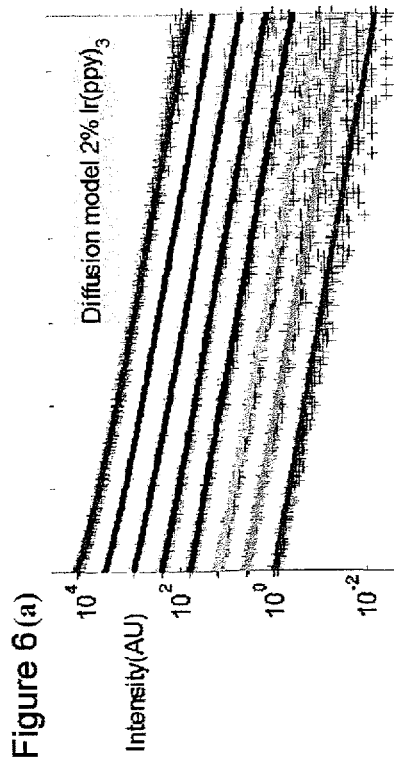
Figure 6D:
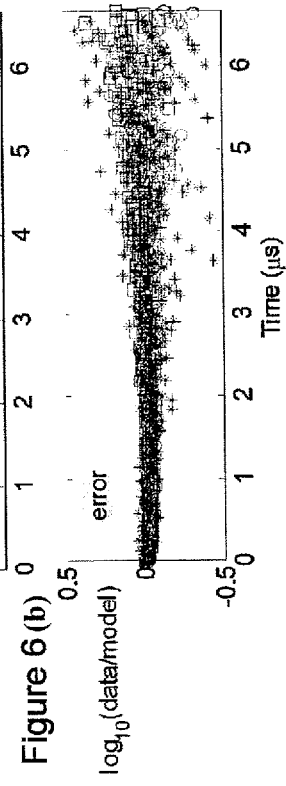
Figure 8A:
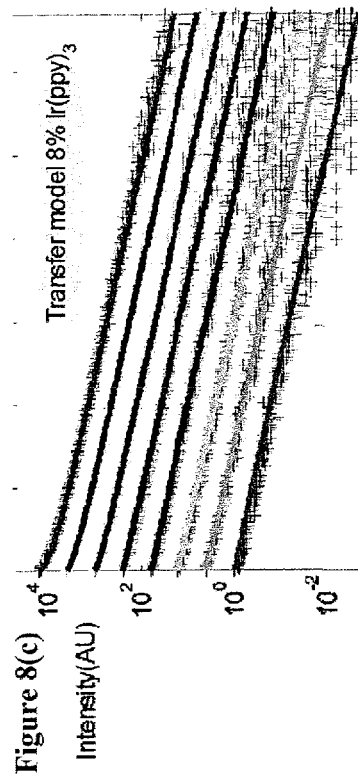
FIGS. 8(a)-8(d): illustrate PL transients of 8% Ir(ppy)$_3$ doped CBP, similarly analyzed as in FIGS. 6(a)-6(d).
Figure 8B:
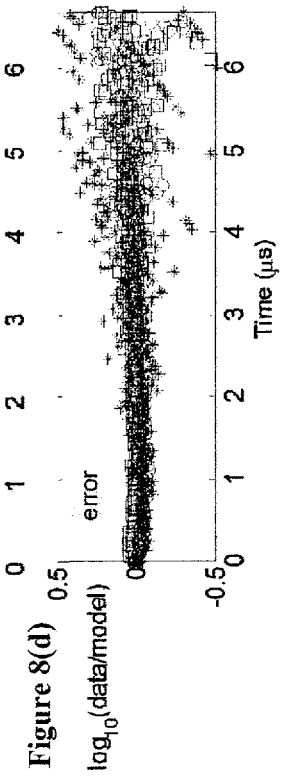
Figure 8C:
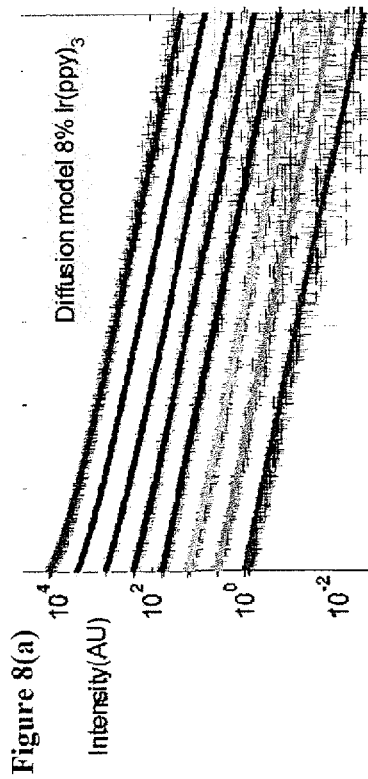
Figure 8D:
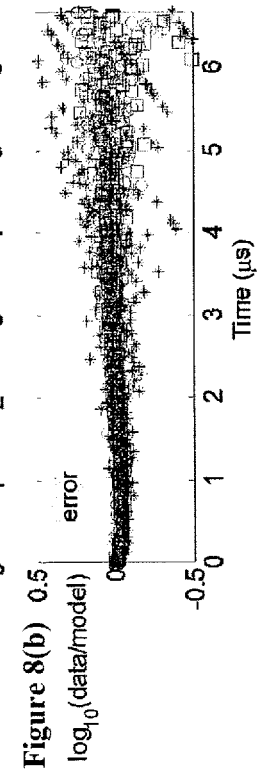
Figure 9A:
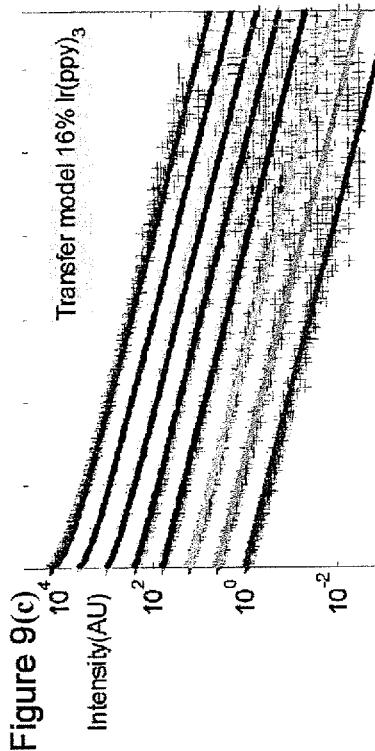
FIGS. 9(a)-9(d): illustrate PL transients of 16% Ir(ppy)$_3$ doped CBP, similarly analyzed as in FIG. 6(a)-6(d).
Figure 9B:
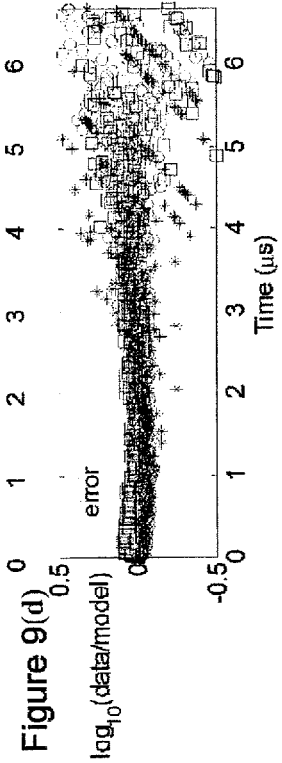
Figure 9C:
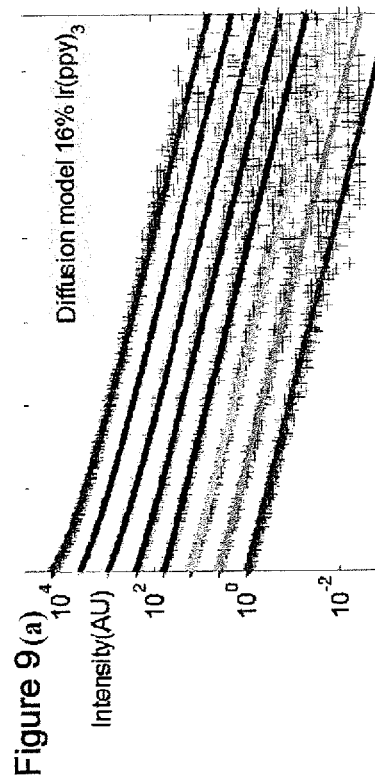
Figure 9D:
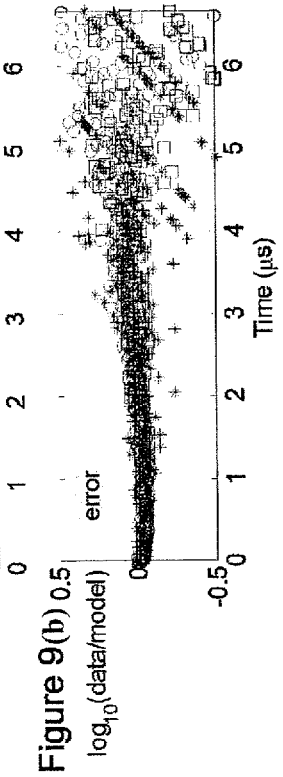
Figure 10A:
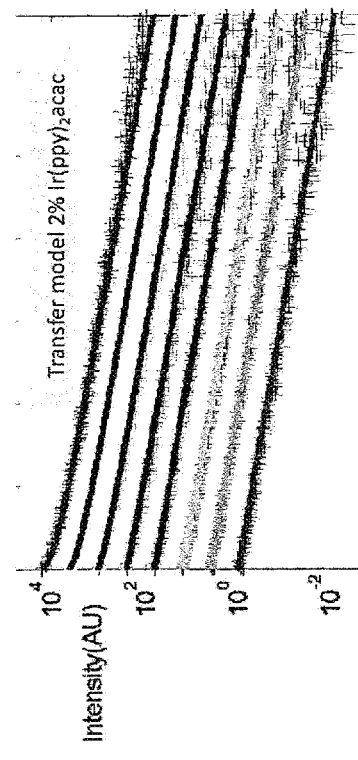
FIGS. 10(a)-10(d): illustrate PL transients of 2% Ir(ppy)$_2$acac doped CBP, similarly analyzed as in FIGS. 6(a)-6(d).
Figure 10B:
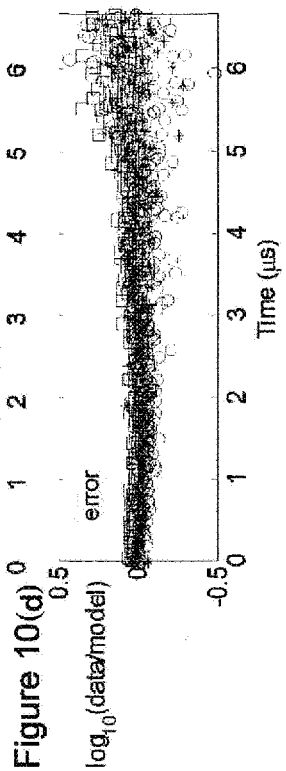
Figure 10C:
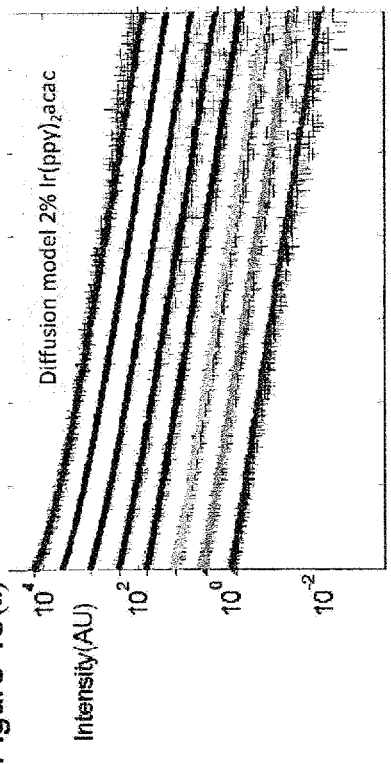
Figure 10D:
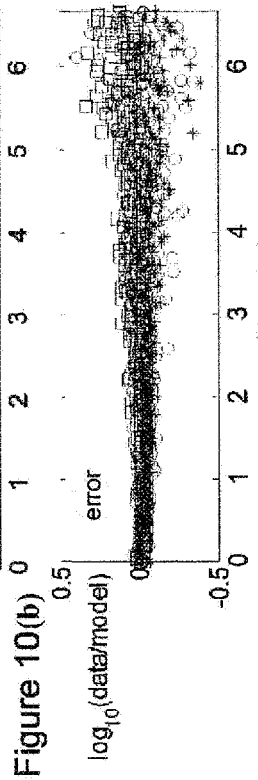
Figure 11A:
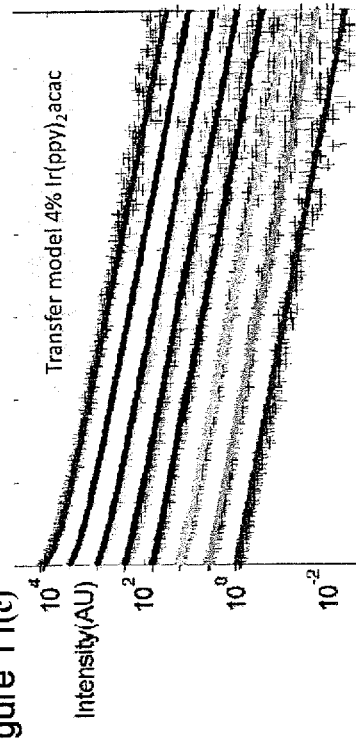
FIG. 11(a)-11(d): illustrate PL transients of 4% Ir(ppy)$_2$acac doped CBP, similarly analyzed as in FIGS. 6(a)-6(d).
Figure 11B:
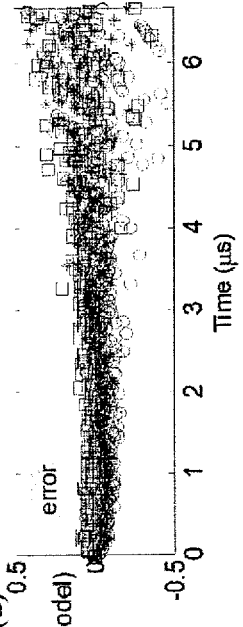
Figure 11C:
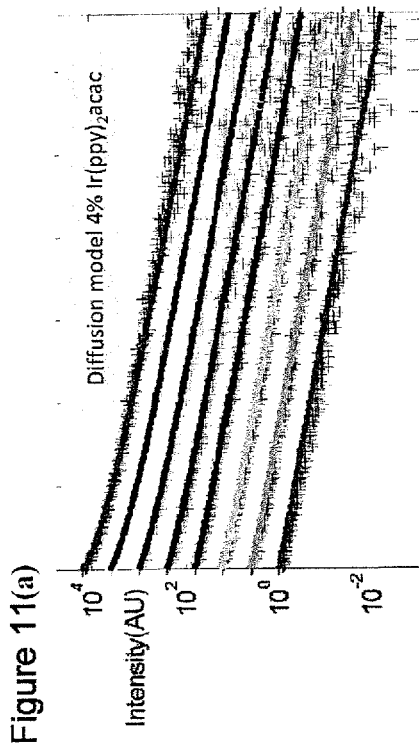
Figure 11D:
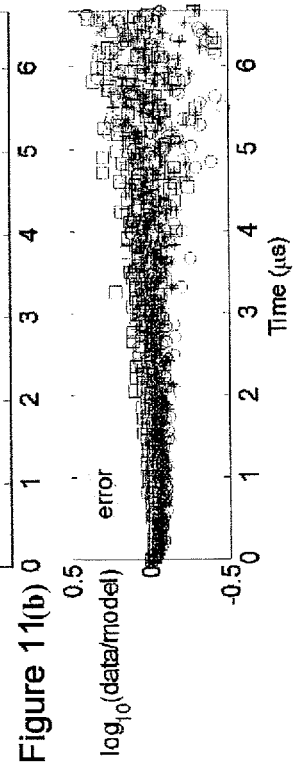
Figures 16B, 16D:
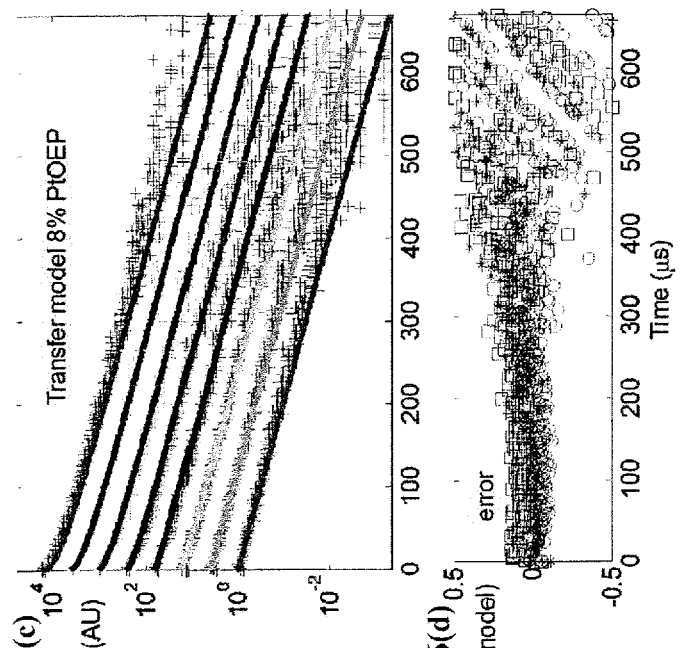
Figure 17A:
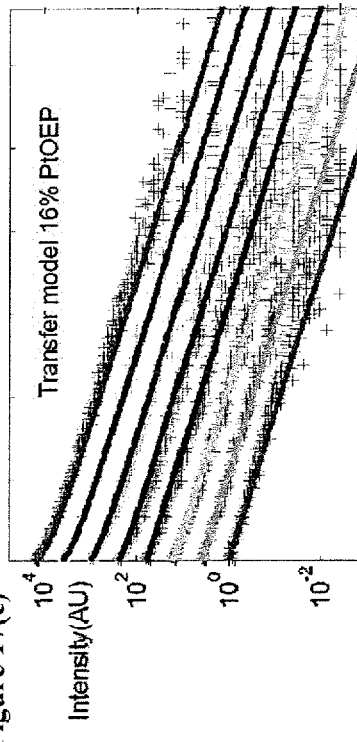
FIG. 17(a)-17(d): illustrate PL transients of 16% PtOEP doped CBP, similarly analyzed as in FIGS. 6(a)-6(d).
Figure 17B:
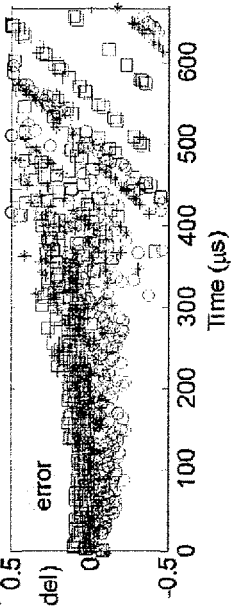
Figure 17C:
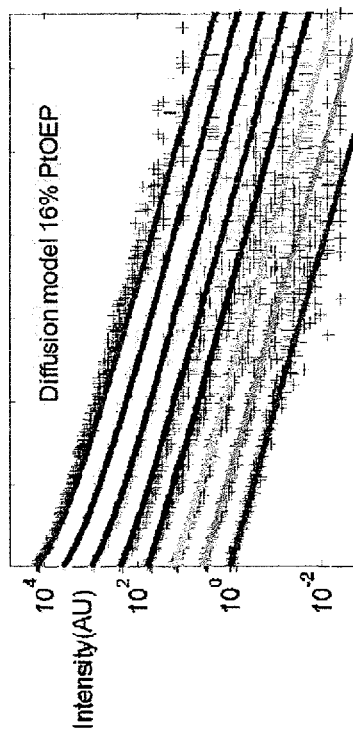
Figure 17D:
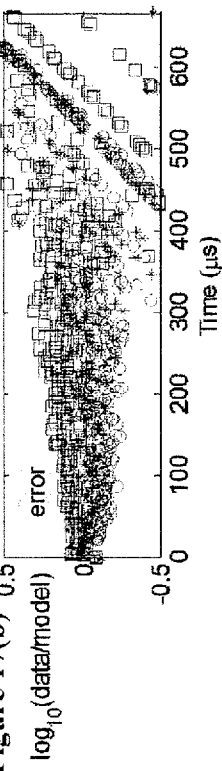

FIG. 5 shows absorption of a solution of Ir(ppy)$_3$ and PtOEP dissolved in toluene. From the PL and absorption spectral overlaps, we find that $J(Ir(ppy)_3) = 50 \times J(PtOEP)$. Since $k_{TT} \propto D_D$, then the difference in J between Ir(ppy)$_3$ and PtOEP must be responsible for the observed differences in the corresponding $k_{TT}$. That is, J for PtOEP is significantly smaller compared to that of the Ir-complexes because its absorption due to $S_0 \to T^*$ is weaker as a result of its reduced metal-ligand-charge-transfer (MLCT) contribution to the optical transitions characteristics of planar Pt compounds which are described in M. A. Baldo et al., Appl. Phys. Lett. 75, 4 (1999); M. A. Baldo et al., Nature 395, 151 (1998); R. R. Lunt et al., J. Appl. Phys. 105, 053711 (2009); and W. Holzer, A. Penzkofer, and T. Tsuboi, Chem. Phys. 308, 93 (2005).

Since the "onset" current density for the roll-off in OLED efficiency at high current densities due to TTA is proportional to $1/(\tau^2 k_{TT})$ [11], the Dexter diffusion mechanism (Eqs. (2) and (16)) suggests that improved performance at high brightness is possible if $\tau$ and $k_{TT}$ can be independently minimized. One means to accomplish this requires a high MLCT contribution to emission (leading to low $\tau$) with a correspondingly large Stokes shift in the MLCT absorption (leading to low $k_{TT}$). Previously, the importance of the Stokes shift has not been emphasized in phosphorescent emitter design since self-absorption is insignificant in thin films typically used in OLED emitting regions.

Figure 21:
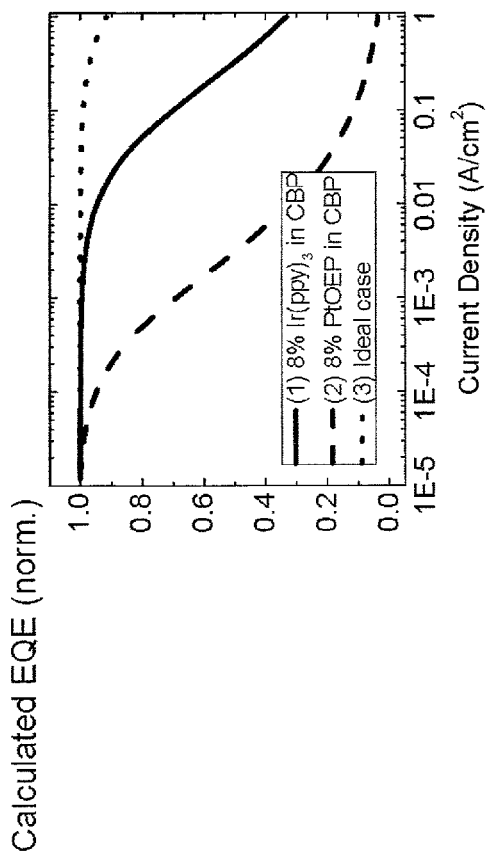
FIG. 21: illustrates calculated EQE(J) for OLEDs with different emissive layers. The idea case is for an emissive layer with τ of 8% Ir(ppy)3:CBP and kTT of 8% PtOEP:CBP.
Figure 22A:
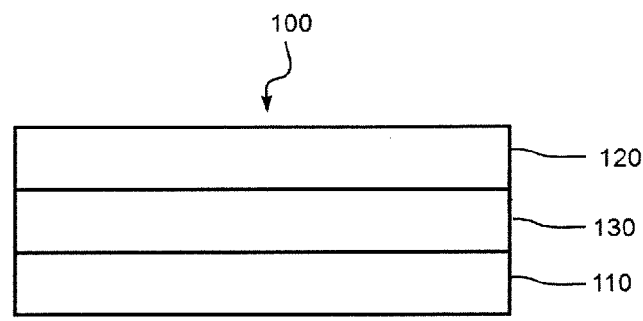
FIG. 22A: illustrates an organic light emitting device 100 including an anode 110; a cathode 120; and an emissive layer 130 disposed between anode 110 and cathode 120.
Figure 22B:
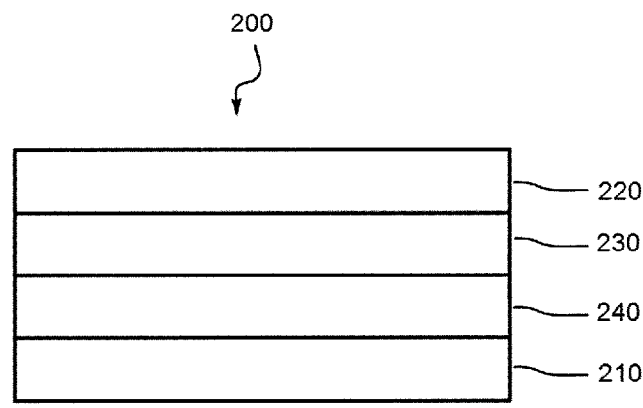
FIG. 22B: illustrates an organic light emitting device 200 including an anode 210; a cathode 220; an emissive layer 230 disposed between anode 210 and cathode 220; and a hole transport layer 240 disposed between emissive layer 230 and anode 210.
Figure 22C:
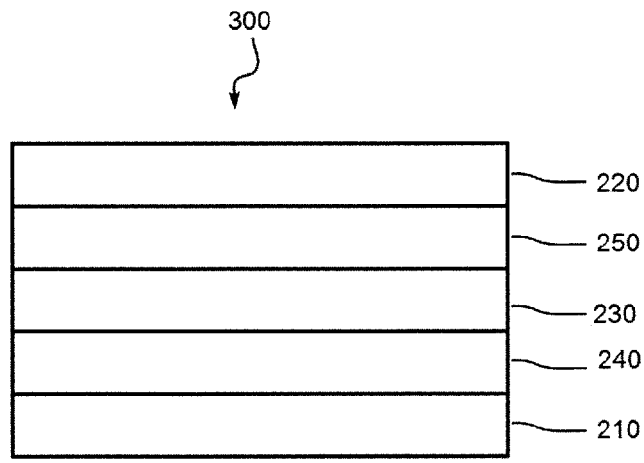
FIG. 22C: illustrates an organic light emitting device 300 including an anode 210; a cathode 220; an emissive layer 230 disposed between anode 210 and cathode 220; a hole transport layer 240 disposed between emissive layer 230 and anode 210; and an electron transport layer 250 disposed between emissive layer 230 and cathode 220.

Since the "onset" current density for the roll-off in OLED efficiency at high current densities due to TTA is proportional to $1/(\tau^2 k_{TT})$ as identified by M. A. Baldo, C. Adachi, and S. R. Forrest, Phys. Rev. B 62, 10967 (2000), the Dexter diffusion mechanism suggests that improved performance at high brightness is possible if $\tau$ and $k_{TT}$ can be independently minimized. FIG. 21 shows the calculated efficiency roll-off through Equation 20, $$EQE(J) = \eta_0 \frac{J_0}{4J}\left(\sqrt{1+\frac{8J}{J_0}}-1\right) \quad (20)$$

where $$J_0 = \frac{2ed}{\tau^2 k_{TT}}.$$

Then, using the parameters in Table 1 for three PHOLEDs with 30 nm of EMLs consisting of (1) 8% Ir(ppy)$_3$:CBP, (2) 8% PtOEP:CBP, and (3) an ideal EML with $\tau$ of 8% Ir(ppy)$_3$:CBP and $k_{TT}$ of 8% PtOEP:CBP. It is evident that simultaneous minimization of $\tau$ and $k_{TT}$ are desirable for PHOLEDs operating at high current density (or luminance).

The results here are in contrast to that of Staroske et al., who proposed minimizing TTA through reducing the phosphorescent emitter PL and triplet-triplet absorption (from T* to a higher triplet excited state) spectral overlap. Besides the potential issues with their model their measured $R_{FTT}$ is different by a factor of 1.5 from their calculated result, leading to an order of magnitude discrepancy in Förster transfer rates from measurement.

The transient PL measurements in three prototype phosphorescent emitters suggests that TTA is dominated by triplet diffusion, and that direct energy transfer from donor to acceptor, as proposed previously, plays a much smaller role. Further, the diffusion of triplets in the doped films follows the Dexter exchange interaction, in which the TTA rate is independent of triplet lifetime. Therefore, phosphorescent emitter designs with high a MLCT contribution to emission and a large Stokes shift can simultaneously minimize triplet lifetime and TTA the transfer rate. This understanding of energy transfer can be used to design efficient OLED emitters with reduced efficiency roll-off at high brightness.

In one embodiment, the present invention provides for an organic light emitting device including a) an anode; b) a cathode; and c) an emissive layer disposed between the anode and the cathode, the emissive layer comprising an organic host compound and a phosphorescent compound exhibiting a Stokes Shift overlap greater than 0.3 eV. In some embodiments, the phosphorescent compound exhibits a Stokes Shift overlap integral of less than 50 $M^{-1}$ $cm^{-1}$. In some embodiments, the phosphorescent compound further exhibits a triplet-triplet annihilation rate constant of less than $1\times10^{-12}$ $cm^3 s^{-1}$. The organic light emitting device may further include a hole transport layer disposed between the emissive layer and the anode; and an electron transport layer disposed between the emissive layer and the cathode. In some embodiments, the phosphorescent compound exhibits a phosphorescent lifetime of less than 10 μs. In some embodiments, the phosphorescent compound exhibits a phosphorescent lifetime of less than 5 μs. In some embodiments, the concentration of the phosphorescent compound ranges from 0.5 wt. % to 10 wt. %.

In some embodiments, the organic light emitting device exhibits a peak external quantum efficiency of greater than 10%. In some embodiments, the organic light emitting device exhibits a roll off quantum efficiency of 50% of the peak external quantum efficiency at a current density greater than 100 mA/cm$^2$.

In some embodiments, the organic light emitting device exhibits a roll off quantum efficiency of 50% of the peak external quantum efficiency at a current density greater 100 mA/cm$^2$ compared to an equivalent device having an emissive layer disposed between the anode and the cathode, the emissive layer comprising an organic host compound and a comparative phosphorescent compound exhibiting a Stokes Shift overlap less than 0.3 eV and a phosphorescent lifetime of less than 5 μs. In some embodiments, comparative phosphorescent compound exhibits a Stokes Shift overlap less than 0.3 eV and a phosphorescent lifetime of greater than 5 μs.

Photoluminescence and triplet absorption spectra for a wide variety of compounds are readily available in the literature or measured by techniques discussed herein or known in the art. From these spectra the Stokes shift and MLCT transitions may be determined. Some of that literature is described herein. These spectra may also be measured. There may be some differences in the values obtained from various measurement techniques. For purposes of comparing spectra to determine relative Stokes shift and/or MLCT transitions, it is preferred that the same or similar measurement is used to obtain the values to be compared.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works, and modeling of specific configurations, are not intended to be limiting.

What is claimed:

1. An organic light emitting device comprising:
   a) an anode;
   b) a cathode;
   c) an emissive layer disposed between the anode and the cathode, the emissive layer comprising an organic host compound and a phosphorescent compound exhibiting a Stokes Shift overlap greater than 0.3 eV; wherein the phosphorescent compound exhibits a Stokes Shift overlap integral of less than 50 $M^{-1}$ $cm^{-1}$.

2. The organic light emitting device of claim 1, wherein the phosphorescent compound exhibits a phosphorescent lifetime of less than 10 µs.

3. The organic light emitting device of claim 1, wherein the phosphorescent compound further exhibits a triplet-triplet annihilation rate constant of less than $1\times10^{-12}$ cm$^3$s$^{-1}$.

4. The organic light emitting device of claim 1, further comprising a hole transport layer disposed between the emissive layer and the anode; and an electron transport layer disposed between the emissive layer and the cathode.

5. The organic light emitting device of claim 1, wherein a concentration of the phosphorescent compound ranges from 0.5 wt. % to 10 wt. %.

6. The organic light emitting device of claim 1, wherein the device exhibits a peak external quantum efficiency of greater than 8%.

7. The organic light emitting device of claim 5, wherein the device exhibits a roll off quantum efficiency of 50% of the peak external quantum efficiency at a current density greater than 100 mA/cm$^2$.

8. The organic light emitting device of claim 1, wherein the device exhibits a roll off quantum efficiency of 50% of the peak external quantum efficiency at a current density greater than 100 mA/cm$^2$ compared to an equivalent device having an emissive layer disposed between the anode and the cathode, the emissive layer comprising an organic host compound and a phosphorescent compound exhibiting a Stokes Shift overlap less than 0.3 eV and a phosphorescent lifetime of less than 10 µs.

9. A method for reducing triplet-triplet annihilation in an organic light emitting device comprising:
   providing a device comprising an anode; a cathode; and an emissive layer disposed between the anode and the cathode, the emissive layer comprising an organic host compound and a phosphorescent compound exhibiting a Stokes Shift overlap greater than 0.3 eV; and wherein the phosphorescent compound exhibits a Stokes Shift overlap integral of less than 50 M$^{-1}$ cm$^{-1}$;
   applying a voltage across the anode and the cathode;
   wherein the device exhibits a peak external quantum efficiency of greater than 10%; and
   wherein the device exhibits a roll off quantum efficiency of 50% of the peak external quantum efficiency at a current density greater than 100 mA/cm$^2$.

10. The method for reducing triplet-triplet annihilation in an organic light emitting device according to claim 9, wherein the phosphorescent compound exhibits a phosphorescent lifetime of less than 10 µs.

11. The method for reducing triplet-triplet annihilation in an organic light emitting device according to claim 9, wherein the phosphorescent compound further exhibits a triplet-triplet annihilation rate constant of less than $1\times10^{-12}$ cm$^3$s$^{-1}$.

* * * * *